(12) United States Patent
Yin et al.

(10) Patent No.: US 8,426,282 B2
(45) Date of Patent: Apr. 23, 2013

(54) METHOD FOR FORMING SEMICONDUCTOR SUBSTRATE ISOLATION

(75) Inventors: Haizhou Yin, Poughkeepsie, NY (US); Zhijiong Luo, Poughkeepsie, NY (US); Huilong Zhu, Poughkeepsie, NY (US)

(73) Assignee: Institute of Microelectronics, Chinese Academy of Sciences, Beingjing (CN)

( * ) Notice: Subject to any disclaimer, the term of this patent is extended or adjusted under 35 U.S.C. 154(b) by 0 days.

(21) Appl. No.: 13/202,606

(22) PCT Filed: Apr. 8, 2011

(86) PCT No.: PCT/CN2011/000613
§ 371 (c)(1),
(2), (4) Date: Aug. 22, 2011

(87) PCT Pub. No.: WO2012/113115
PCT Pub. Date: Aug. 30, 2012

(65) Prior Publication Data
US 2012/0214289 A1   Aug. 23, 2012

(30) Foreign Application Priority Data
Feb. 21, 2011 (CN) .......................... 2011 1 0041586

(51) Int. Cl.
*H01L 21/336* (2006.01)
(52) U.S. Cl.
USPC .......................................... 438/297; 438/439

(58) Field of Classification Search .................. 438/423, 438/196, 218, 248, 225, 297, 438, 362
See application file for complete search history.

(56) References Cited

U.S. PATENT DOCUMENTS

| | | | |
|---|---|---|---|
| 6,399,461 B1 * | 6/2002 | Liu et al. ...................... | 438/436 |
| 6,576,558 B1 * | 6/2003 | Lin et al. ...................... | 438/700 |
| 6,740,565 B2 * | 5/2004 | Matsumura et al. .......... | 438/407 |
| 2001/0008292 A1 * | 7/2001 | Leobandung et al. ........ | 257/347 |
| 2007/0218603 A1 * | 9/2007 | Dyer et al. .................... | 438/153 |
| 2008/0203484 A1 * | 8/2008 | Hofmann et al. ............. | 257/369 |
| 2008/0258181 A1 * | 10/2008 | Cannon et al. ................ | 257/255 |
| 2012/0104497 A1 * | 5/2012 | Denison et al. ............... | 257/348 |

* cited by examiner

*Primary Examiner* — Thao Le
(74) *Attorney, Agent, or Firm* — Troutman Sanders LLP

(57) ABSTRACT

The present invention provides a method for forming a semiconductor substrate isolation, comprising: providing a semiconductor substrate; forming a first oxide layer and a nitride layer sequentially on the semiconductor substrate; forming openings in the nitride layer and in the first oxide layer to expose parts of the semiconductor substrate; implanting oxygen ions into the semiconductor substrate from the openings; performing annealing to form a second oxide layer on at least top portions of the exposed parts of the semiconductor substrate; and removing the nitride layer and the first oxide layer. Compared to the conventional STI process, said method enables a more simply and easy process flow and is applicable to common semiconductor substrates and SOI substrates.

8 Claims, 3 Drawing Sheets

METHOD FOR FORMING SEMICONDUCTOR SUBSTRATE ISOLATION

CROSS-REFERENCE TO RELATED APPLICATION

This application is a Section 371 National Stage Application of, and claims priority to, International Application No. PCT/CN2011/000613 filed on Apr. 8, 2011, which claimed priority to Chinese Application No. 201110041586.2 filed on Feb. 21, 2011. Both the International Application and the Chinese Application are incorporated herein by reference in their entireties.

FIELD OF THE INVENTION

The present invention relates to the field of semiconductor fabrication, and in particular, to a method for forming a semiconductor substrate isolation by SIMOX (Separation by Implanted Oxygen) technology.

BACKGROUND OF THE INVENTION

The process of Shallow Trench Isolation (STI) is a standard process for forming isolation regions in a semiconductor substrate, which is widely used in semiconductor industry at present, especially in Ultra Large Scale Integration (ULSI) circuits. The process of STI includes three main steps of trench etching, oxide filling and oxide planarization. Compared to earlier isolation formation processes such as Local Oxidation of Silicon (LOCOS), the process of STI is more complicated.

It is already known in related art that a SOI (Silicon-on-Insulator) wafer is fabricated by the SIMOX technique. In this case, oxygen ions of a high dose are implanted into monocrystalline silicon to form an isolation layer under a high temperature condition, and then an annealing process is performed under a super-high temperature, so as to form a new type semiconductor material of a three-layer structure consisting of a top silicon layer, a buried silicon dioxide layer and a bulk silicon, see U.S. Pat. No. 6,740,565B2, titled "Process for fabrication of a SIMOX substrate".

In view of the above, there is a need to develop a much easier isolation formation process by using techniques in the semiconductor micro fabrication field, such as SIMOX and/or other techniques to adapt to applications of the semiconductor industry.

SUMMARY OF THE INVENTION

An object of the present invention is to solve the above-mentioned technical problems, especially to provide a method for forming a semiconductor substrate isolation by the SIMOX technology.

To achieve the above object, the present invention provides a method for forming a semiconductor substrate isolation, comprising: providing a semiconductor substrate; forming a first oxide layer and a nitride layer sequentially on the semiconductor substrate; forming openings in the nitride layer and in the first oxide layer to expose parts of the semiconductor substrate; implanting oxygen ions into the semiconductor substrate from the openings; performing annealing to form a second oxide layer on at least top portions of the exposed parts of the semiconductor substrate; and removing the nitride layer and the first oxide layer.

Preferably, the semiconductor substrate isolation is formed by using the second oxide layer as an isolation region.

The present invention provides the method of forming the semiconductor substrate isolation by implanting oxygen ions into parts of the semiconductor substrate and performing high temperature annealing using the SIMOX process. Compared to the conventional STI process, said method enables a more simply and easy process flow and is applicable to common semiconductor substrates and SOI (Semiconductor-on-Insulator) substrates.

Part of additional aspects and advantages of the present invention will be given in the following description, and part thereof will become obvious from the following description or be learned through practicing the present invention.

BRIEF DESCRIPTION OF THE DRAWINGS

The above and/or additional aspects and advantages of the present invention will become obvious and easily understood from the following description of the embodiments in conjunction with the accompany drawings. The drawings of the present invention are schematic, and thus are not drawn to scale, in which.

DETAILED DESCRIPTION OF THE PREFERRED EMBODIMENTS

Figure 1:
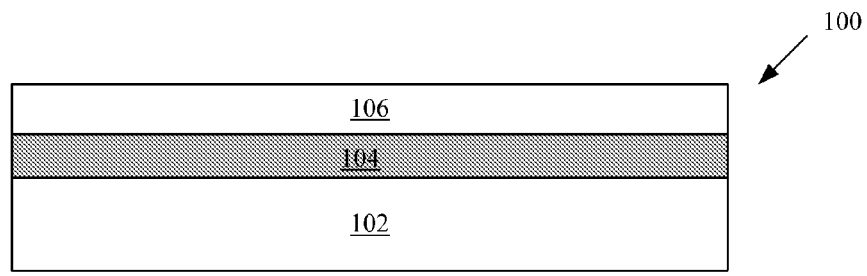
FIGS. 1-8 show sectional views of the device structures corresponding to the individual steps of the method for forming a substrate isolation according to an embodiment of the present invention.

The embodiments of the present invention will be described in detail below, and examples of said embodiments are shown in the drawings. The embodiments described below with reference to the drawings are exemplary, which are only for illustrating the present invention rather than limiting the present invention.

The following disclosure provides a plurality of different embodiments or examples to achieve different structures of the present invention. To simplify the disclosure of the present invention, description of the components and arrangements of specific examples is given below. Of course, they are only illustrative and not intended to limit the present invention. Moreover, in the present invention, reference numbers and/or letters may be repeated in different embodiments. Such repetition is for the purposes of simplification and clearness, and does not denote the relationship between respective embodiments and/or arrangements being discussed. In addition, the present invention provides various examples for specific process and materials. However, it is obvious for those of ordinary skilled in the art that other process and/or materials may alternatively be utilized. Furthermore, the following structure in which a first object is "on" a second object may include an embodiment in which the first object and the second object are formed to be in direct contact with each other, and may also include an embodiment in which another object is formed between the first object and the second object such that the first and second objects might not be in direct contact with each other.

The individual steps of the embodiments of the present invention will be described in detail below with reference to the drawings.

In step S01, a semiconductor substrate 100 is provided, as shown in FIG. 1. The semiconductor substrate 100 may include any suitable semiconductor substrate material, which may be, but not limited to, Si, Ge, GeSi, semiconductor-on-insulator (e.g. silicon-on-insulator or SiGe-on-insulator), SiC, GaAs or any III/V compound semiconductor, and so on. According to design specifications known in the art (for example, a p-type substrate or an n-type substrate), the semiconductor substrate 100 may comprise various kinds of doping configurations. The embodiment of the present invention uses a silicon-on-insulator substrate as an example, which comprises a bulk silicon substrate 102, a buried oxide layer (e.g. silicon oxide layer) 104 on the bulk silicon substrate, and a silicon layer 106 on the buried oxide layer 104, wherein the buried oxide layer preferably has a thickness of 5 nm-10 nm.

Figure 2:
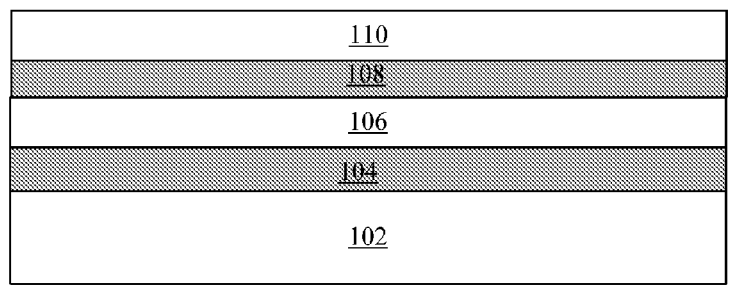

In step S02, a first oxide layer 108 and a nitride layer 110 are formed successively on the semiconductor substrate 100, as shown in FIG. 2.

The process for forming the first oxide layer 108 on the silicon layer 106 involves oxidizing the top portions of the semiconductor substrate (e.g. the top portions of the silicon layer 106), or depositing the first oxide layer on the semiconductor substrate. The deposition may be performed by, for example, sputtering, Pulsed Laser Deposition (PLD), Metal Organic Chemical Vapor Deposition (MOCVD), Atomic Layer Deposition (ALD), Plasma Enhanced Atomic Layer Deposition (PEALD), or other appropriate techniques.

In the embodiment of the present invention, the first oxide layer 108 may be silicon oxide, which has a thickness of 2 nm-10 nm, for example 5 nm. Next, the nitride layer 110 is deposited on the first oxide layer 108 by means of any one of the deposition techniques mentioned above for forming the first oxide layer. The nitride layer 110 is used as a hard mask, so it should be thick enough to block the subsequent oxygen ions implantation. The thickness of the nitride layer 110 in the embodiment of the present invention may be 50 nm-80 nm, for example, 60 nm.

Figure 3:
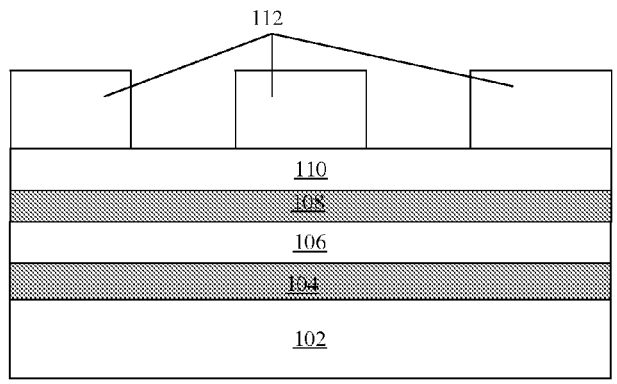
Figure 4:
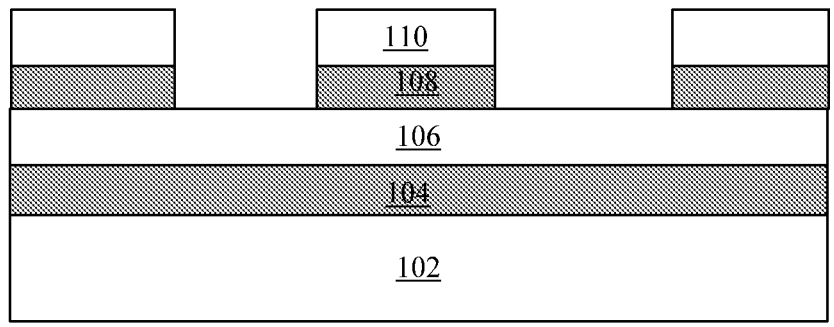

In step S03, openings are formed in the nitride layer 110 and the first oxide layer 108 so as to expose parts of the semiconductor substrate 100. Specifically, it may comprise the steps of:

First, forming a patterned photoresist layer 112 on the nitride layer 110 to expose the nitride layer 110 on parts of the semiconductor substrate 100, as shown in FIG. 3; and then, etching the exposed nitride layer 110 and the first oxide layer 108 thereunder, and removing the photoresist layer 112, as shown in FIG. 4.

Figure 5:
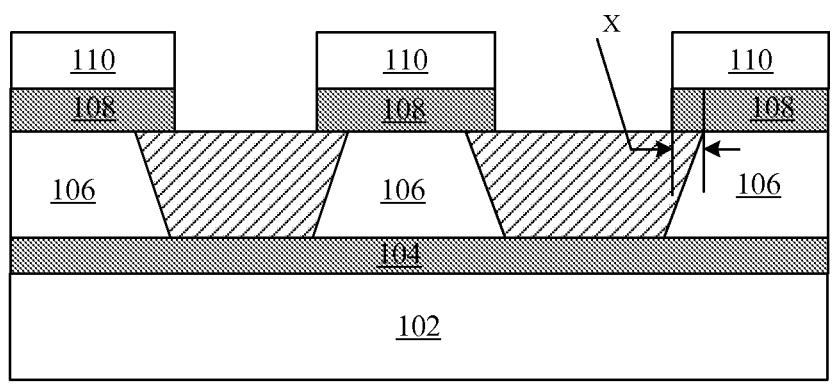

In step S04, oxygen ions are implanted into the semiconductor substrate 100 from the openings, as shown in FIG. 5.

Specifically, the amount of oxygen ions implanted into the semiconductor substrate 100 (i.e. the silicon layer 106 in the embodiment of the present invention) from the openings may be adjusted by changing implantation parameters (e.g. implantation energy and implantation dose). Then, the second oxide layer is formed in portions of the semiconductor substrate 100 corresponding to the openings by a subsequent heat treatment process. In the embodiment of the present invention, the bottom of the formed second oxide layer may reach the buried oxide layer 104 of the silicon-on-insulator substrate. Reference can be made to U.S. Pat. No. 6,740,565 B2, titled "Process for fabrication of a SIMOX substrate" to find details of implantation parameters. For example, the implantation energy may be 10 KeV-150 KeV, and the implantation dose may be 2E17-2E18 ions/cm$^2$. In the embodiment of the present invention, preferably, the oxygen ions may be implanted by at least two ion implantation operations, so that the implanted oxygen ions may have a uniform concentration distribution in the depth direction of the semiconductor substrate 100.

In addition, in practical applications, the ion implantation region may usually extend laterally, so that parts of the semiconductor substrate covered by the first oxide layer 108 are oxidized (i.e., parts of the silicon layer 106 covered by the first oxide layer 108 are oxidized in the embodiment of the present invention, as shown by region X indicated by lateral arrows in FIG. 5). In order to obtain the isolation region of a pre-defined size, the sizes of the openings should be designed to be smaller than that of the isolation region when designing the size of the photolithographic template, which facilitates correction of errors.

Figure 6:
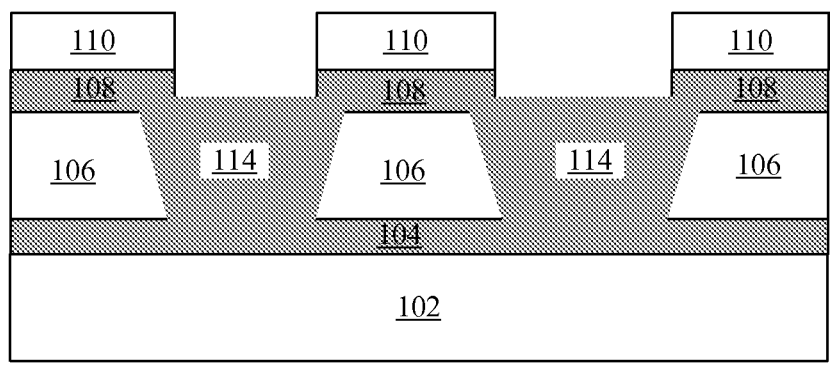

In step S05, an annealing process is performed to form the second oxide layer 114 in at least the top portions of the parts of the semiconductor substrate 100, as shown in FIG. 6.

In the embodiment of the present invention, the silicon layer 106 located in the parts of the semiconductor substrate 100 that have been implanted with oxygen ions is converted into a silicon oxide layer, i.e. the second oxide layer 114, by annealing. Reference can be made to U.S. Pat. No. 6,740,565 B2, titled "Process for fabrication of a SIMOX substrate" to find details of annealing parameters. For example, the annealing may be performed at a high temperature of about 800° C.-1200° C. for about 3-6 hours.

Figure 7:
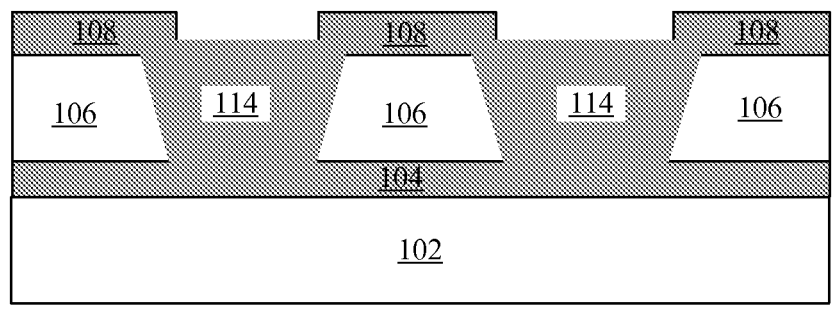
Figure 8:
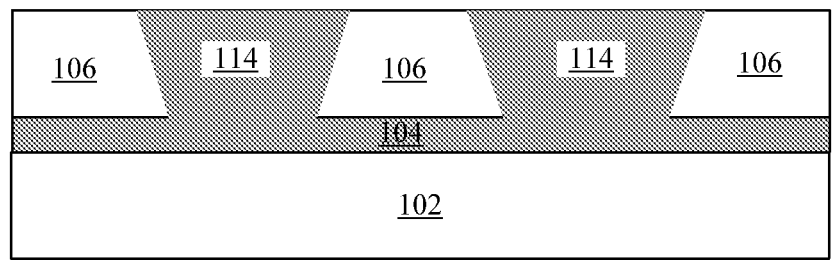

In step S06, the nitride layer 110 and the first oxide layer 108 are removed, as shown in FIGS. 7 and 8. For example, the removing may be performed by using hydrofluoric acid; or be performed by firstly removing the nitride layer 110 by hot phosphoric acid as shown in FIG. 7 and then removing the first oxide layer 108 by hydrofluoric acid as shown in FIG. 8.

So far, isolation regions in the semiconductor substrate 100 are formed, as shown in FIG. 8. In the embodiment of the present invention, the second oxide layer 114 that has been subjected to the above-mentioned processes forms the isolation region, and the exposed silicon layer 106 forms the active region.

By means of the SIMOX process, the present invention provides the method of forming the semiconductor substrate isolation by implanting oxygen ions into parts of the semiconductor substrate and performing high temperature annealing. Compared with the conventional STI process, said method enables a more simply and easy process flow and is applicable to common semiconductor substrates and SOI substrates.

While the embodiments of the present invention have been shown and described, it shall be understood by those having ordinary skill in the art that various changes, modifications, substitutions and variations can be made to said embodiments without departing from the principle and spirit of the invention. The scope of the present invention is defined by the appended claims and their equivalents.

What is claimed is:

1. A method for forming a semiconductor substrate isolation, comprising:
   providing a SOI substrate, the SOI substrate comprising an insulating layer and a silicon layer on the insulating layer;
   forming a first oxide layer and a nitride layer sequentially on the SOI substrate;
   etching the nitride layer and the first oxide layer until parts of an upper surface of the SOI substrate are exposed, so as to form openings only in the nitride layer and the first oxide layer;
   implanting oxygen ions into the silicon layer of the SOI substrate and up to the insulating layer of the SOI substrate from the openings;
   performing annealing to form a second oxide layer, wherein the bottom of the second oxide layer reaches an upper surface of the insulating layer of the SOI substrate; and
   removing the nitride layer and the first oxide layer.

2. The method according to claim 1, characterized in that the step of forming the first oxide layer comprises one of the following steps: oxidizing the top portions of the SOI substrate; and depositing the first oxide layer on the SOI substrate.

3. The method according to claim 1, characterized in that the oxygen ions are implanted with an implantation energy of about 10 KeV-150 KeV and an implantation dose of about 2E17-2E18 ions/cm2.

4. The method according to claim 1, characterized in that the oxygen ions are implanted by at least two implantation operations.

5. The method according to claim 1, characterized in that the second oxide layer is used as an isolation region.

6. The method according to claim 5, characterized in that the sizes of the openings are smaller than that of the isolation region.

7. The method according to claim 1, characterized in that the annealing is performed at a temperature of about 800° C.-1200° C. for about 3-6 hours.

8. The method according to claim 1, characterized in that the step of removing is performed by using hydrofluoric acid, or is performed by firstly removing the nitride layer by hot phosphoric acid and then removing the first oxide layer by hydrofluoric acid.

* * * * *